(12) United States Patent
Chen et al.

(10) Patent No.: US 7,675,604 B2
(45) Date of Patent: Mar. 9, 2010

(54) HOOD FOR IMMERSION LITHOGRAPHY

(75) Inventors: Li-Jui Chen, Hsin-Chu (TW);
Tzung-Chi Fu, Maioli (TW); Ching-Yu Chang, Yilang County (TW); Fu-Jye Liang, Kaohsiung (TW); Lin-Hung Shiu, Hsinchu (TW); Chun-Kuang Chen, Hsin-Chu (TW); Tsai-Sheng Gau, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 205 days.

(21) Appl. No.: 11/427,434

(22) Filed: Jun. 29, 2006

(65) Prior Publication Data

US 2007/0258060 A1 Nov. 8, 2007

Related U.S. Application Data

(60) Provisional application No. 60/797,443, filed on May 4, 2006.

(51) Int. Cl.
*G03B 27/52* (2006.01)
*G03B 27/42* (2006.01)

(52) U.S. Cl. .......................................... 355/30; 355/53

(58) Field of Classification Search .................. 355/30, 355/53, 72, 75; 378/34; 359/380, 886
See application file for complete search history.

(56) References Cited

U.S. PATENT DOCUMENTS

| | | | |
|---|---|---|---|
| 6,686,570 B2 | 2/2004 | Furukawa et al. | |
| 6,952,253 B2 | 10/2005 | Lof et al. | |
| 2005/0083496 A1* | 4/2005 | Dansberg et al. | 355/30 |
| 2006/0033892 A1* | 2/2006 | Cadee et al. | 355/30 |
| 2007/0209433 A1* | 9/2007 | Gehman et al. | 73/204.26 |

* cited by examiner

*Primary Examiner*—Peter B Kim
(74) *Attorney, Agent, or Firm*—Haynes and Boone, LLP

(57) ABSTRACT

A lithography apparatus includes an imaging lens module; a substrate table positioned underlying the imaging lens module and configured to hold a substrate; a fluid retaining module configured to hold a fluid in a space between the imaging lens module and a substrate on the substrate stage; and a heating element configured in the fluid retaining module and adjacent to the space. The heating element includes at least two of following: a sealant insoluble to the fluid for sealing the heating element in the fluid retaining module; a sealed opening configured in one of top portion and side portion of the fluid retaining module for sealing the heating element in the fluid retaining module; and/or a non-uniform temperature compensation device configured with the heating element.

20 Claims, 7 Drawing Sheets

HOOD FOR IMMERSION LITHOGRAPHY

CROSS REFERENCES

This application claims priority from U.S. Provisional Patent Application Ser. No. 60/797,443 filed on May 4, 2006, entitled "A Hood for Immersion Lithography".

BACKGROUND

As semiconductor fabrication technologies progress to smaller feature sizes such as 65 nanometers, 45 nanometers, and below, immersion lithography methods are being adopted to address the problems associated with such fabrication. During an exposure process using an immersion lithography system, evaporation effects in various locations and other effects associated with immersion fluid will cool down a wafer in process. A heater has been included and sealed in the immersion hood for temperature compensation. However, the sealed opening of the immersion hood directly contacts the immersion fluid. The sealant of the opening becomes a particle source and introduces contamination to the immersion fluid, the immersion lithography system, and further contaminates the wafer in process and/or cause lithography exposure defects on the wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
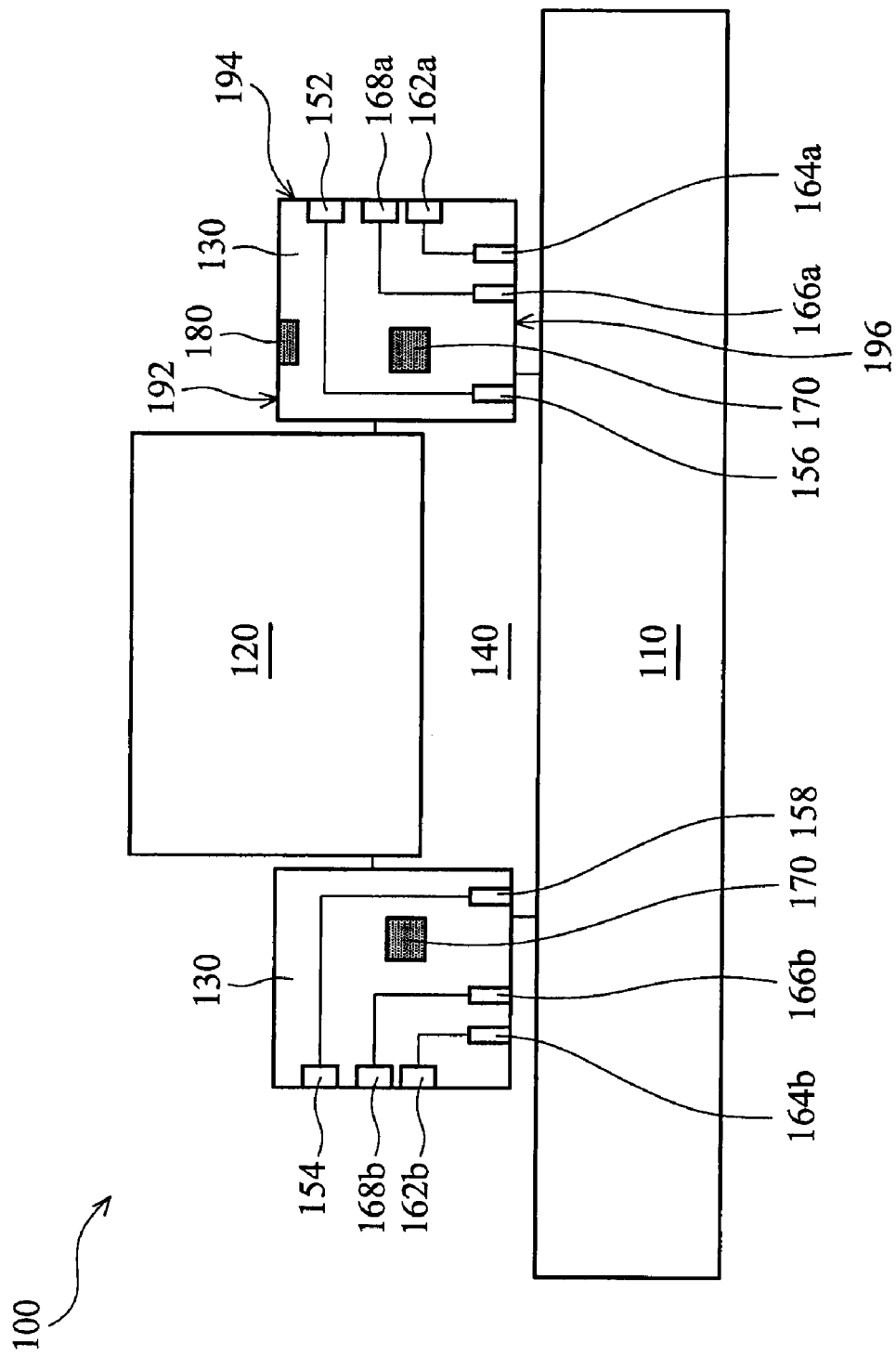
FIGS. 1a and 1b illustrate sectional views of various embodiments of an immersion lithography system having a heating element integrated therein.

It is understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1a, illustrated is a sectional view of an embodiment of an immersion lithography system 100. The system 100 includes a substrate table 110 to hold a substrate to be processed by the system 100 for lithography patterning. The substrate table 110 can be a substrate stage or include a substrate stage as a part thereof. The substrate table 110 is operable to secure and move a substrate relative to the system 100. For example, the substrate table 110 may be designed to be capable of translational and/or rotational displacement for substrate alignment, stepping, and scanning. The substrate table 110 may include various components suitable to perform precise movement.

A substrate to be held by the substrate table 110 and processed by the system 100 may be a semiconductor wafer such as a silicon wafer. Alternatively, the semiconductor wafer may include an elementary semiconductor, a compound semiconductor, an alloy semiconductor, or combinations thereof. The semiconductor wafer may include one or more material layers such as poly-silicon, metal, and/or dielectric, to be patterned. The substrate may further include an imaging layer formed thereon. The imaging layer can be a photoresist layer (resist layer) that is responsive to an exposure process for creating patterns thereon. The imaging layer may be a positive or negative type resist material and may have a multi-layer structure. One exemplary resist material is chemical amplifier (CA) resist.

The immersion lithography system 100 includes an imaging lens systems 120 (or lens system) configured on the substrate table 110. A semiconductor wafer may be positioned on the substrate table 110 underlying the lens system 120. The lens system 120 may further include or be integral to an illumination system (e.g., a condenser) which may have a single lens or multiple lenses and/or other lens components. For example, the illumination system may include microlens arrays, shadow masks, and/or other structures. The lens system 120 may further include an objective lens which may have a single lens element or a plurality of lens elements. Each lens element may include a transparent substrate and may further include a plurality of coating layers. The transparent substrate may be a conventional objective lens, and may be made of fused silica ($SiO_2$), calcium-fluoride ($CaF_2$), lithium fluoride (LiF), barium fluoride ($BaF_2$), or other suitable material. The materials used for each lens element may be chosen based on the wavelength of light used in the lithography process to minimize absorption and scattering.

The system 100 includes a fluid retaining module 130 designed for providing and holding a first fluid 140. The fluid retaining module may substantially include an alloy such as stainless steel. The first fluid may include an immersion fluid such water. The immersion fluid may include water solution, de-ionized water-DIW, gas, or other proper fluid having an index of refraction higher than that of water. The immersion fluid may further include an additive. The immersion fluid retaining module 130 may be positioned proximate (such as around) the lens system 120 and designed for other functions, in addition to holding the immersion fluid. For example, the fluid retaining module 130 is also designed to provide a second fluid for constraining the first fluid 140. The second fluid may be air such as dry air. The second fluid may alternatively include humidified air, hydrophobic liquid, or other suitable fluid.

The fluid retaining module 130 may include various features such as apertures and paths for providing the first and second fluids for a lithography exposure process, and/or performing other proper functions. Particularly, the module 130 includes an aperture 152 as an immersion fluid inlet to provide and transfer the immersion fluid 140 into a space between the lens system 120 and the substrate on the substrate table 110. The module 130 also includes an immersion fluid outlet 154 as a drain for the immersion fluid. The module 130 further includes an aperture 156 and another aperture 158 configured to form a path for the immersion fluid. The path is from the immersion fluid inlet 152, to the aperture 156, the space between the lens system 120 and a substrate on the substrate table 110, the aperture 158, and the immersion fluid outlet 154. The module 130 may further include a second fluid inlet 162a, an aperture 164a, another aperture 166a, and a second fluid outlet 168a, configured to from a path for the second fluid. The second fluid flows out the aperture 164a, through a space between the module 130 and a substrate on the substrate table 110, and then into the aperture 166a. The second fluid provides a pressure to restrain the immersion fluid 140 in the space between the lens system 120 and the substrate on the substrate table 110. Similarly, the module 130 may include additional paths designed for the second fluid and configured around the lens system 120. For example, the module 130 may further include a second fluid inlet 162b, an aperture 164b, another aperture 166b, and a second fluid outlet 168b, configured to form another path for the second fluid.

The system 100 includes a heating element 170 configured in and/or integrated with the fluid retaining module 130. The heating element 170 is designed to provide heat to the immersion fluid 140 and the substrate positioned on the substrate table 110, and compensates heat loss from factors including the evaporation effects during an immersion lithography process. The heating element 170 may be designed in various configurations such as in a circular, a curve, or an arc layout.

The fluid retaining module 130 and the heating element 170 make up an immersion hood. The heating element 170 may implement a mechanism including a coil, fluid such as a liquid or a gas, a lamp such as a halogen lamp, or a combinations thereof. In one example, the coil made of a conductive material is configured and designed operable for carrying on a electric current. The joule heat generated thereby during a lithography process can be transferred to the immersion fluid 140 flowing through between the space between the lens system 120 and further to the substrate to be processed, resulting temperature compensation and control. In another example, a heated fluid is introduced into the module 130 for providing heating power and temperature control. The heated fluid may include a liquid such as water or a gas such as air. In another example, the heating element 170 may employ a lamp such as halogen lamp to provide heating power.

Figure 2:
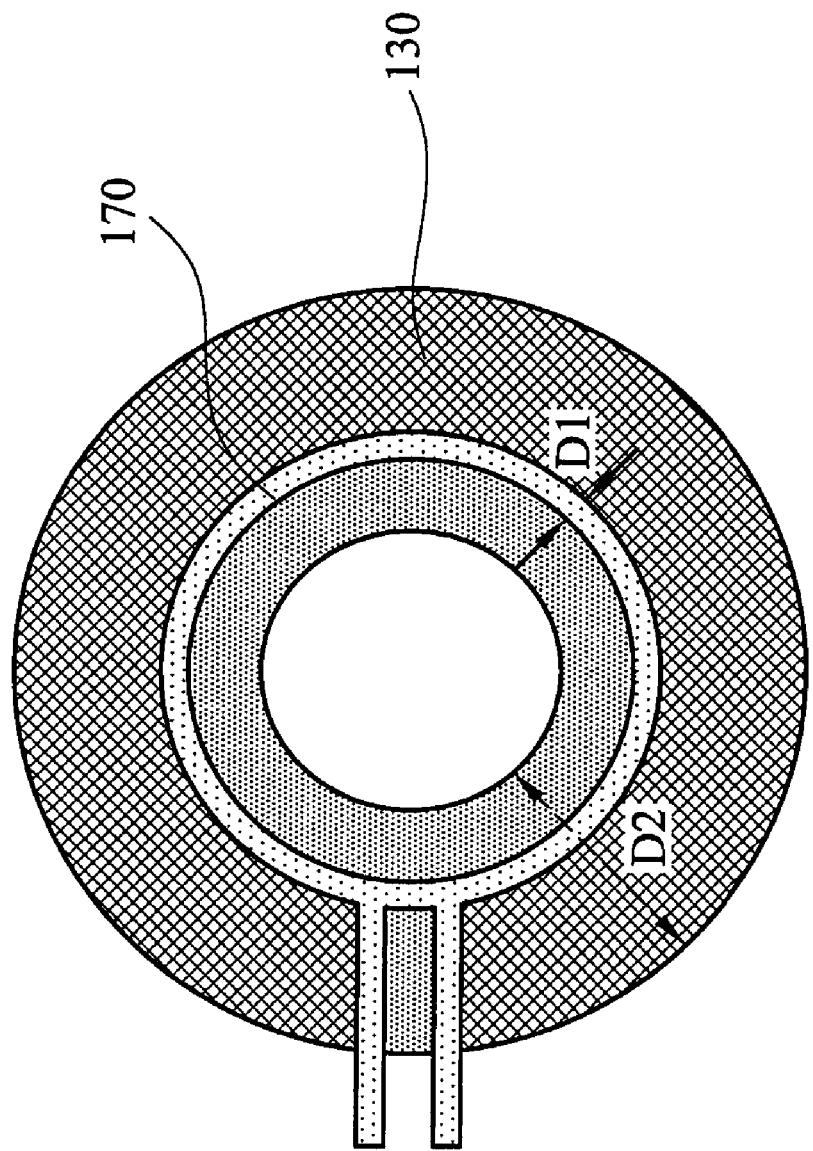
FIG. 2 illustrates a top view of one embodiment of an immersion hood having a heating element integrated therein.

With an additional reference to FIG. 2 as a top view of the immersion hood, the heating element 170 is further described below. Other features including inlets, outlets, and apertures for the first and second fluids are not shown on FIG. 2 for simplicity. The heating element 170 is positioned in the fluid retaining module 130 in a proper configuration for an enhanced heating effect. The heating element 170 may be designed to have a plurality of segments. The heating element 170 may be configured in a straight line, curved, in a circle, or in an arc. The heating element 170 may have a wall thickness D1 less than about 1/15 of a diametrical width D2 of the fluid retaining module 130 measured from an inner boundary to an outer boundary in a diametrical direction.

Figure 1B:
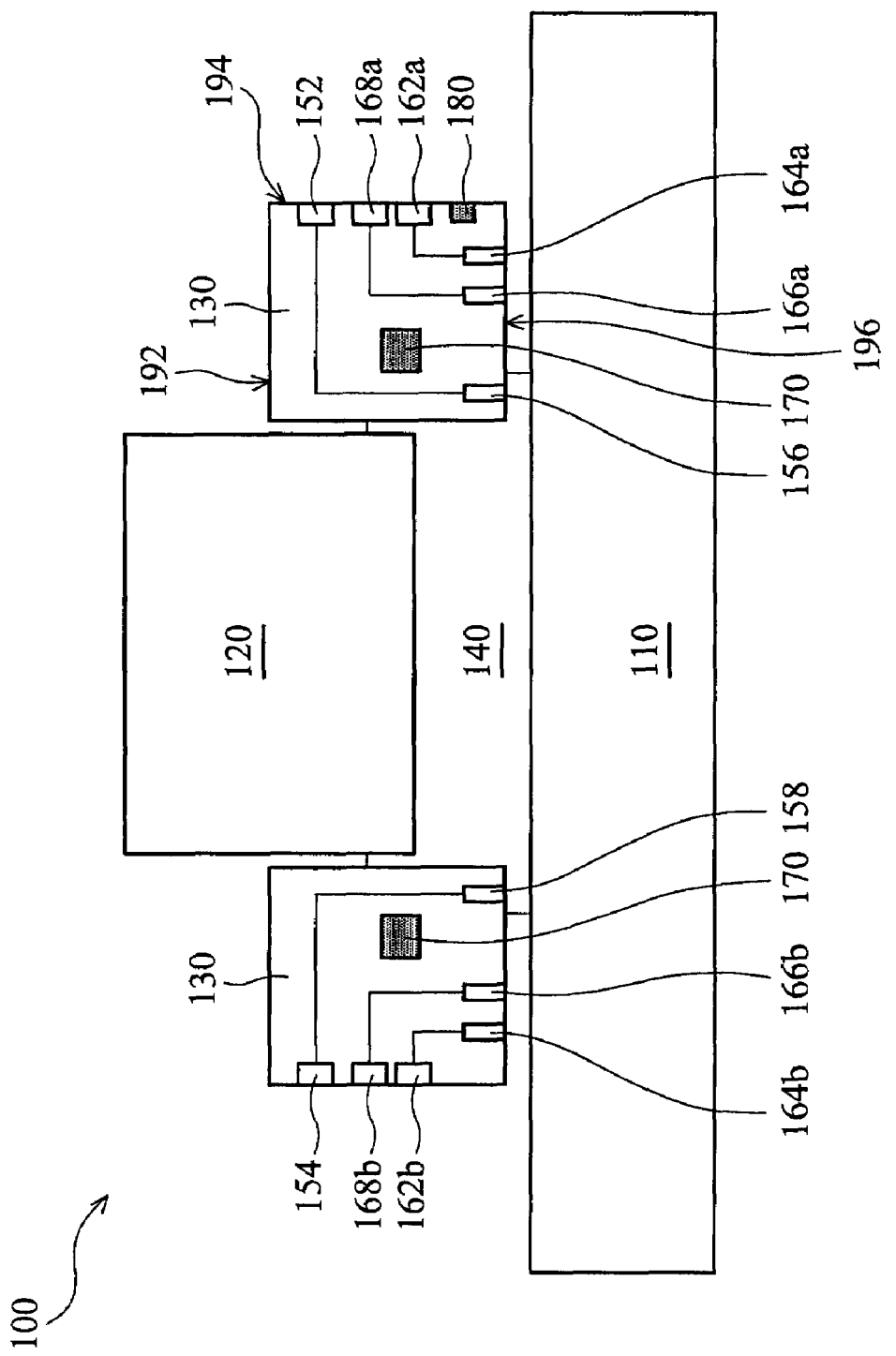

The fluid retaining module 130 may include a sealed opening 180 designed for inserting the heating element 170 therein. The sealed opening 180 may have a dimension ranging between about 1 mm and 10 mm. The sealed opening 180 may be positioned in a top portion 192 of the module 130. Alternatively, as illustrated in FIG. 1b, the sealed opening 180 may be positioned in a side portion 194 of the module 130. Since the sealed opening 180 is designed in the module 130 away from a bottom portion 196 of the module 130, the contaminations from the sealant to the immersion fluid is substantially eliminated. In a further example, the heating element 170 is built in the fluid retaining module 130 without any exposed sealing openings. For instance, the module 130 may include two parts, such as two monolithic parts, designed and manufactured with recesses to include the heating element 170 therein. The two separate parts are combined together thereafter by a method such as welding, interlock, and/or other mechanical or chemical securing techniques.

The sealed opening 180 may collectively or alternatively be designed having a sealant insoluble to the immersion fluid and the second fluid. The sealant utilized in the sealed opening 180 may include a material selected from alloy, ceramic, polymer material, or combinations thereof. For example, the alloy sealant includes a stainless steel. In another example, the ceramic sealant may include quartz and/or zerodur. In another example, the polymer sealant may include Polytetrafluoroethylene (PTFE or TEFLON) and/or a plastic polymer. In a further example, the polymer sealant may include a cross-linked polymer material, achieved by ultraviolet (UV) radiation and/or a thermal treatment. Alternatively, the sealed opening 180 may further include a cover layer coated on a sealant soluble or insoluble to the immersion fluid. The cover layer includes a material insoluble to the immersion fluid and the second fluid. Since the cover layer is insoluble, the associated contaminations from the sealant in the sealed opening 180 are eliminated. By utilizing an insoluble sealant and/or an insoluble cover layer, the sealed opening 180 may be alternatively configured in the bottom portion 196 of the module 130 without contaminating the immersion fluid and the substrate in process.

Figure 3B:
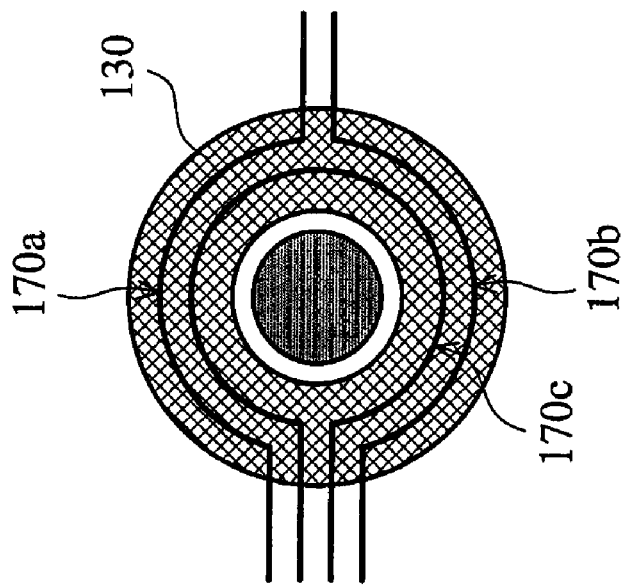
FIGS. 3a through 3e illustrate top views of various embodiments of an immersion hood having a heating element integrated therein.
Figure 3A:
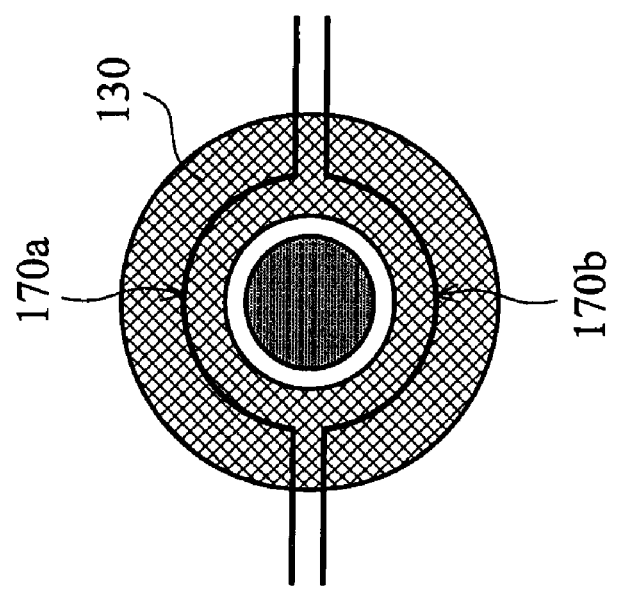
Figure 3C:
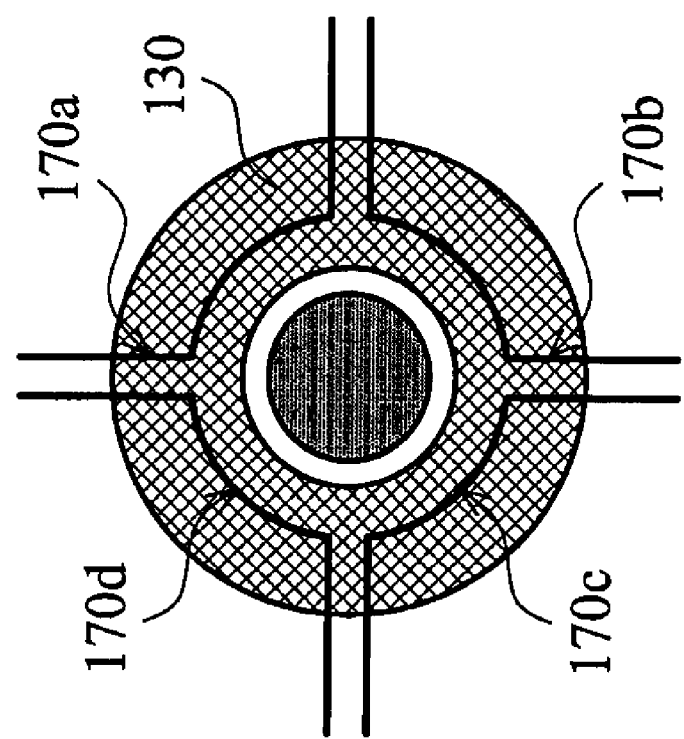

The heating element 170 may be designed to compensate heat loss in a non-uniform mode. In one embodiment, the heating element 170 includes a plurality of segments (or portions) configured operable for a non uniform temperature compensation. For an example as illustrated in FIG. 3a, the heating element 170 includes two heating coils 170a and 170b configured each in substantially a half circle. Different electric powers applicable and controllable respectively to the two heating coils 170a and 170b can provide different heating powers and temperature compensation effects to two corresponding regions (an upper region and a lower region) of the module 130. Thus non uniform heat losses in the two corresponding regions may be effectively compensated. In another example as illustrated in FIG. 3b, the heating element 170 includes three heating coils 170a, 170b, and 170c configured in substantially two circles with various diameters. Different electric powers applicable and controllable to the three heating coils 170a, 170b, and 170c can provide different heating powers and temperature compensation effects to corresponding regions (e.g. an inner region and an outer region) of the module 130. Thus non uniform heat losses in the two corresponding regions may be effectively compensated. In another example as illustrated in FIG. 3c, the heating element 170 includes four heating coils 170a, 170b, 170c, and 170d configured each in substantially an one fourth circle. Different electric powers applicable and controllable to the four heating coils 170a through 170d can provide different heating powers and thermal compensation effects to four corresponding regions of the module 130, and fulfill compensating non uniform heat losses in the four corresponding regions.

Figure 3E:
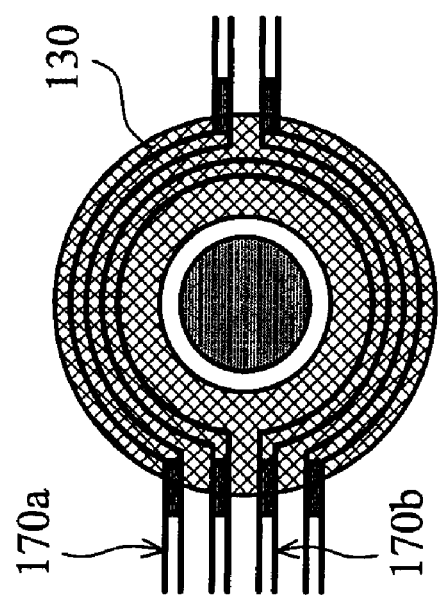
Figure 3D:
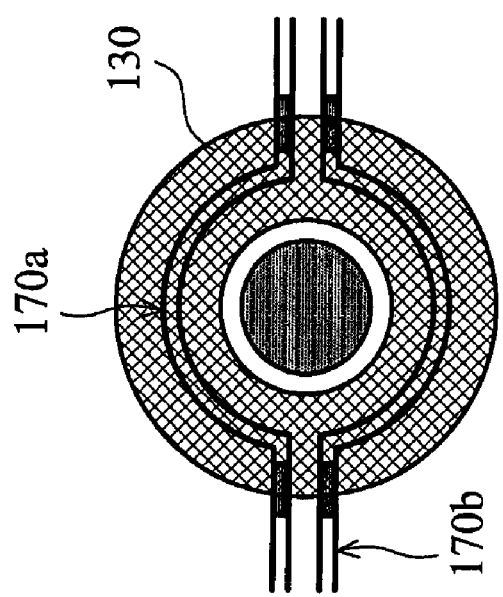

In another example as illustrated in FIG. 3d, the heating element 170 includes two fluid channels 170a and 170b configured each substantially in a half circle. Each fluid channel may designed operable to have different heating power such as by providing heated fluids having different temperatures, different flowing rates, and/or different pressures. Thus the two corresponding regions of the module 130 may receive different heating powers and thermal compensation effects. In a further example as illustrated in FIG. 3e, the heating element 170 includes two fluid channels 170a and 170b configured each in substantially a circle with different diameters. Each fluid channel may designed operable to have different temperatures, flowing rates, or pressures. Thus the two corresponding regions (an inner region and an outer region) of the module 130 may receive different heating powers and thermal compensation effects. In another example, multiple halogen lamps may be configured in various locations of the module 130 to form an array in implementing localized heating compensation. Furthermore, in various examples described in FIGS. 3a through 3e, the heating power to each region may be dynamically adjustable according to on process parameters such as a local temperature measured by a thermal sensor configured in the system 100, to implement a location dependent thermal compensation.

The heating element 170 can be integrated with the fluid retaining module 130 in various ways and techniques. For example, the heating coil(s) may be shrunk into smaller dimensions at a very low temperature, inserted into a space inside of the module 130, and then expanded in the space at a normal temperature and secured therein. The low temperature can be provided to the coil(s) by a method such as utilizing a liquid nitrogen.

The system 100 having an immersion hood with the fluid retaining module 130 and the heating integrated therein may have different variations to reduce contaminations from the sealant, fulfill localized thermal compensation, and achieve other performance enhancements. For example, the system 100 may include various sensors such as thermal sensors, position sensors, and pressure sensors configured to respectively sense temperatures, positions, and pressures including a temperature of the substrate in process, a position of the substrate table 110 or a distance between the fluid retaining module 130 and a substrate on the substrate table, and a pressure of the first and second fluids. The substrate table 110 may additionally include various heating features integrated therein or a mechanism to provide heated fluid to the substrate table.

The immersion lithography system 100 may further include a radiation source. The radiation source may be a suitable ultraviolet (UV) or extra UV(EUV) light source. For example, the radiation source may be a mercury lamp having a wavelength of 436 nm (G-line) or 365 nm (I-line); a Krypton Fluoride (KrF) excimer laser with wavelength of 248 nm; an Argon Fluoride (ArF) excimer laser with a wavelength of 193 nm; a Fluoride (F2) excimer laser with a wavelength of 157 nm; or other light sources having a desired wavelength (e.g., below approximately 100 nm).

A photomask (also referred to as a mask or a reticle) may be introduced into the system 100 during an immersion lithography process. The mask may include a transparent substrate and a patterned absorption layer. The transparent substrate may use fused silica (SiO2), such as borosilicate glass and soda-lime glass. The transparent substrate may use calcium fluoride and/or other suitable materials. The patterned absorption layer may be formed using a plurality of processes and a plurality of materials, such as depositing a metal film made with chromium (Cr) and iron oxide, or an inorganic film made with MoSi, ZrSiO, SiN, and/or TiN.

Figure 4:
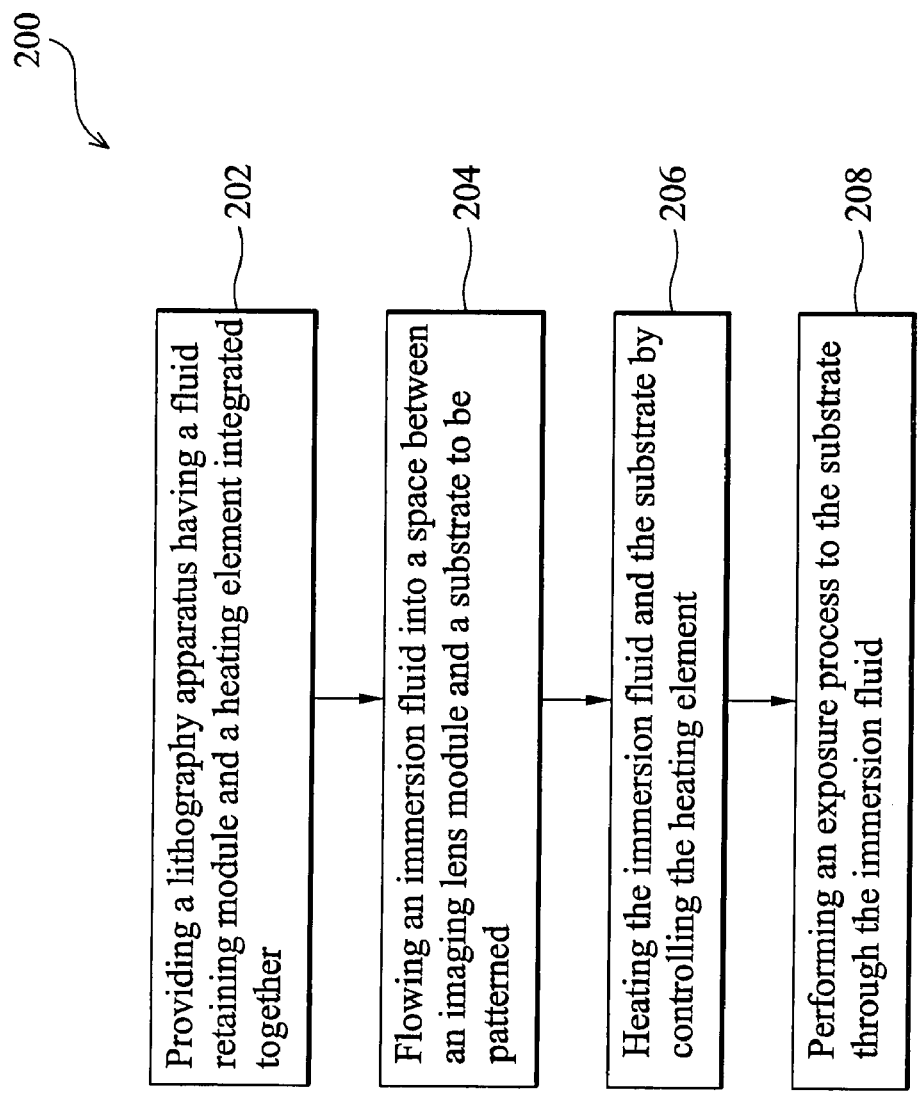
FIG. 4 is a flowchart of one embodiment of a method for utilizing an immersion lithography system having a heating element integrated therein.

FIG. 4 provides a flowchart of one exemplary method 200 for utilizing an immersion lithography apparatus such as the immersion lithography system 100. The method 200 begins at step 202 by providing a lithography apparatus having a fluid retaining module and a heating element integrated together. The lithography apparatus may be substantially similar to the immersion lithography system 100. A mask having a predefined pattern may also be provided and positioned properly in the immersion lithography apparatus. A substrate to be processed is also provided and positioned on a substrate table of the lithography apparatus. The substrate may be a semiconductor wafer coated with an imaging layer such as a photoresist layer.

The method 200 may proceed to step 204 by flowing an immersion fluid such as water into a space between an imaging lens module and the substrate on the substrate table. At step 204, a second fluid such as air may also be provided in support to restrain the immersion fluid in a space between a lens system and the substrate.

The method 200 may proceed to step 206 by heating the immersion fluid and the substrate on the substrate table through controlling the heating element. The heating element may be dynamically controlled to provide thermal compensation uniformly or non uniformly. The steps 204 and 206 may be carried out in a different sequence.

The method 200 may proceed to step 208 by performing an exposure process to the substrate through the immersion fluid. A radiation energy such as an ultraviolet (UV) light may be projected through the immersion fluid and on to the substrate in process. The substrate may be exposed in various proper modes such as a step-and-scan mode. Each field of the substrate is stepped under the projected UV radiation and scanned by the UV radiation. During the exposure process at step 208, the thermal compensation from the heating element at step 206 and the fluids provided at step 204 may be continued through the exposure process of step 208.

Other processing steps may be additionally or alternatively performed before, between, and/or after the steps 202 through 208 described above. For example, baking the photoresist layer and developing thereof may be performed after the exposure process at step 208.

Thus, the present disclosure provides a lithography apparatus. The lithography apparatus includes an imaging lens module; a substrate table positioned underlying the imaging lens module and configured to hold a substrate; a fluid retaining module configured to hold a fluid in a space between the imaging lens module and a substrate on the substrate stage; and a heating element configured in the fluid retaining module and adjacent to the space. The heating element includes at least one of: the heating element being sealed in the fluid retaining module with a sealant insoluble to the fluid; the heating element being sealed in the fluid retaining module with a sealed opening configured in one of top portion and side portion of the fluid retaining module; and the heating element having a plurality of portions designed operable to control temperature locally.

In the lithography apparatus, the sealant may include a material selected from the group consisting of alloy, ceramic, polymer, and combinations thereof. The sealant may include a material selected from the group consisting of stainless steel, quartz, zerodur, polytetrafluorethylene, plastic polymer, and combinations thereof. The sealed opening may have a dimension ranging between about 1 mm and 10 mm. The heating element may include a heating mechanism selected from the group consisting of coil, fluid, lamp, and combinations thereof. The heating element may include a heating mechanism selected from the group consisting of a conductive coil, liquid, gas, and halogen lamp. The heating element may have a wall thickness less than about 1/15 of a diametrical width of the fluid retaining module. The heating element may include a plurality of segments configured in the fluid retaining module. The heating element may include a configuration selected from the group consisting of in a circle, curved, in a straight line, in an arc, and combinations thereof. The heating element may include one of two segments and four segments curved in a circle in the fluid retaining module.

The present disclosure also provides an immersion hood integrated in an immersion lithography apparatus. The immersion hood includes a fluid retaining module configured to provide a fluid for immersion lithography processing; and a heating element configured in the fluid retaining module. The heating element includes at least one of the heating element being sealed in the fluid retaining module with a sealant insoluble to the fluid; the heating element being sealed in the fluid retaining module with a sealed opening configured in one of top portion and side portion of the fluid retaining module; and the heating element being designed operable to provide a non uniform temperature compensation.

In the disclosed immersion hood, the fluid retaining module may include a first fluid supply unit and a second fluid supply unit partially configured in a bottom portion of the fluid retaining module, in providing a first fluid and a second fluid, respectively. The first fluid may include an immersion fluid. The immersion fluid may include water. The second fluid may include air. The sealant may include a material selected from the group consisting of alloy, ceramic, polymer, and combinations thereof. The heating element may include a heating mechanism selected from the group consisting of coil, fluid, lamp, and combinations thereof. The heating element may include a plurality of portions designed controllable to provide a non-uniform temperature compensation.

The present disclosure also provides a method for utilizing an immersion lithography apparatus having a heating element integrated. The method includes providing a lithography apparatus having a fluid retaining module and a heating element integrated together; flowing an immersion fluid into a space between an imaging lens module and a substrate to be patterned; heating the immersion fluid and the substrate by controlling the heating element; and performing an exposure process to the substrate through the immersion fluid.

The heating element may include at least one of the heating element being sealed in the fluid retaining module with a sealant insoluble to the fluid; the heating element being sealed in the fluid retaining module with a sealed opening configured in one of top portion and side portion of the fluid retaining module; and the heating element having a plurality of portions designed operable to control temperature locally. The heating of the immersion fluid and the substrate may include controlling the heating element to provide a heat compensation locally.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A lithography apparatus, comprising:
   an imaging lens module;
   a substrate table positioned underlying the imaging lens module and configured to hold a substrate;
   a fluid retaining module configured to hold a fluid in a space between the imaging lens module and a substrate on the substrate stage; and
   a heating element integrated in the fluid retaining module and adjacent to the space, wherein the heating element includes at least two of:
   a sealant in contact with the fluid of the space and configured so that the heating element is sealed in the fluid retaining module with the sealant, which is insoluble to the fluid;
   a sealed opening in contact with the fluid of the space and configured so that the heating element is sealed in the fluid retaining module with the sealed opening, the sealed opening being configured in a bottom portion or a side portion of the fluid retaining module; and
   a plurality of portions of the heating element having designed to operably and locally control temperature by heating the fluid in a first region of the fluid retaining module different from heating the fluid in a second region of the fluid retaining module.

2. The apparatus of claim 1, wherein the sealant comprises a material selected from the group consisting of alloy, ceramic, polymer, and combinations thereof.

3. The apparatus of claim 1, wherein the sealant comprises a material selected from the group consisting of stainless steel, quartz, zerodur, polytetrafluorethylene, plastic polymer, and combinations thereof.

4. The apparatus of claim 1, wherein the sealed opening has a dimension ranging between about 1 mm and about 10 mm.

5. The apparatus of claim 1, wherein the heating element comprises a heating mechanism selected from the group consisting of coil, fluid, lamp, and combinations thereof.

6. The apparatus of claim 1, wherein the heating element comprises a heating mechanism selected from the group consisting of a conductive coil, liquid, gas, and a halogen lamp.

7. The apparatus of claim 1, wherein the heating element has a wall thickness less than about $\frac{1}{15}$ of a diametrical width of the fluid retaining module.

8. The apparatus of claim 1, wherein the heating element comprises a plurality of segments configured in the fluid retaining module.

9. The apparatus of claim 1, wherein the heating element comprises a configuration selected from the group consisting of in a circle, curved, in a straight line, in an arc, and combinations thereof.

10. The apparatus of claim 1, wherein the heating element comprises one of two segments and four segments curved in a circle in the fluid retaining module.

11. An immersion hood integrated in an immersion lithography apparatus, comprising:
    a fluid retaining module configured to provide a fluid for immersion lithography processing; and
    a heating element configured in the fluid retaining module, the heating element including at least two of:
    a sealant in contact with the fluid and insoluble to the fluid for sealing the heating element in the fluid retaining module;
    a sealed opening in contact with the fluid and configured in one of a bottom portion and a side portion of the fluid retaining module for sealing the heating element in the fluid retaining module; and
    a non-uniform temperature compensation device configured with the heating element, wherein the non-uniform temperature compensation device is operable to heat the fluid in a first region of the fluid retaining module different from heating the fluid in a second region of the fluid retaining module.

12. The immersion hood of claim 11, wherein the fluid retaining module comprises a first fluid supply unit and a second fluid supply unit partially configured in a bottom portion of the fluid retaining module, in providing a first fluid and a second fluid, respectively.

13. The immersion hood of claim 12, wherein the first fluid comprises an immersion fluid.

14. The immersion hood of claim 13, wherein the immersion fluid comprises water.

15. The immersion hood of claim 12, wherein the second fluid comprises air.

16. The immersion hood of claim 11, wherein the sealant comprises a material selected from the group consisting of alloy, ceramic, polymer, and combinations thereof.

17. The immersion hood of claim 11, wherein the heating element comprises a heating mechanism selected from the group consisting of coil, fluid, lamp, and combinations thereof.

18. The immersion hood of claim 11, wherein the heating element comprises a plurality of portions designed controllable to provide a non-uniform temperature compensation.

19. A method, comprising:
providing a lithography apparatus having a fluid retaining module and a heating element integrated together, wherein the heating element includes at least two of:
the heating element being sealed in the fluid retaining module with a sealant insoluble to the fluid;
the heating element being scaled in the fluid retaining module with a scaled opening in contact with an immersion fluid and configured in one of a bottom portion and a side portion of the fluid retaining module; and
the heating element having a plurality of portions designed operable to control temperature locally by heating the immersion fluid in a first region of the fluid retaining module different from heating the immersion fluid in a second region of the fluid retaining module;
flowing the immersion fluid into a space between an imaging lens module and a substrate to be patterned;
heating the immersion fluid and the substrate by controlling the heating element; and
performing an exposure process to the substrate through the immersion fluid.

20. The method of claim 19, wherein heating the immersion fluid and the substrate comprises controlling the heating element to provide a heat compensation locally.

* * * * *